(12) United States Patent
Ryoki et al.

(10) Patent No.: US 10,249,678 B2
(45) Date of Patent: Apr. 2, 2019

(54) IMAGING DEVICE, METHOD OF DRIVING IMAGING DEVICE, AND IMAGING SYSTEM

(71) Applicant: CANON KABUSHIKI KAISHA, Tokyo (JP)

(72) Inventors: Tatsuya Ryoki, Kawasaki (JP); Daisuke Kobayashi, Kawaguchi (JP); Tetsunobu Kochi, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/824,053

(22) Filed: Nov. 28, 2017

(65) Prior Publication Data

US 2018/0175103 A1 Jun. 21, 2018

(30) Foreign Application Priority Data

Dec. 15, 2016 (JP) .................................. 2016-243111

(51) Int. Cl.
*H01L 27/146* (2006.01)
*H01L 27/148* (2006.01)
*H04N 5/378* (2011.01)

(52) U.S. Cl.
CPC .. *H01L 27/14812* (2013.01); *H01L 27/14609* (2013.01); *H01L 27/14643* (2013.01); *H04N 5/378* (2013.01)

(58) Field of Classification Search
CPC combination set(s) only.
See application file for complete search history.

(56) References Cited

U.S. PATENT DOCUMENTS

| 6,188,094 B1 | 2/2001 | Kochi et al. |
| 6,605,850 B1 | 8/2003 | Kochi et al. |
| 6,670,990 B1 | 12/2003 | Kochi et al. |

(Continued)

FOREIGN PATENT DOCUMENTS

JP 2015-177349 A 10/2015

OTHER PUBLICATIONS

U.S. Appl. No. 15/630,013, filed Jun. 22, 2017. Applicant: Kazuhiro Saito, et al.

(Continued)

*Primary Examiner* — Van N Chow
(74) *Attorney, Agent, or Firm* — Venable LLP

(57) ABSTRACT

An imaging device includes pixels each including a photoelectric converter generating charges, a holding portion holding charges transferred from the photoelectric converter, and an amplifier unit outputting a signal based on charges transferred from the holding portion. Each pixel outputs, to an output line, a signal based on charges generated by the photoelectric converter during an exposure period including a first period during which the photoelectric converter holds charges generated in the first period and a second period during which the photoelectric converter or the holding portion holds charges generated in the second period while the holding portion is holding charges generated in the first period, and resets the holding portion after outputting a signal based on charges held in the holding portion in the first period and before transferring charges generated in the first period from the photoelectric converter to the holding portion.

15 Claims, 13 Drawing Sheets

(56) References Cited

U.S. PATENT DOCUMENTS

| | | |
|---|---|---|
| 6,717,151 B2 | 4/2004 | Tashiro et al. |
| 6,800,836 B2 | 10/2004 | Hamamoto et al. |
| 6,946,637 B2 | 9/2005 | Kochi et al. |
| 7,016,089 B2 | 3/2006 | Yoneda et al. |
| 7,110,030 B1 | 9/2006 | Kochi et al. |
| 7,129,458 B2 | 10/2006 | Hamamoto et al. |
| 7,135,668 B2 | 11/2006 | Kochi et al. |
| 7,221,397 B1 | 5/2007 | Kochi |
| 7,335,869 B2 | 2/2008 | Kochi |
| 7,423,790 B2 | 9/2008 | Kochi et al. |
| 7,473,882 B2 | 1/2009 | Kochi |
| 7,566,857 B2 | 7/2009 | Kochi |
| 7,592,575 B2 | 9/2009 | Kochi |
| 7,616,355 B2 | 11/2009 | Yoneda et al. |
| 7,816,755 B2 | 10/2010 | Yamazaki et al. |
| 7,864,384 B2 | 1/2011 | Yoneda et al. |
| 7,889,254 B2 | 2/2011 | Kochi et al. |
| 7,907,196 B2 | 3/2011 | Ogura et al. |
| 7,936,487 B2 | 5/2011 | Yoneda et al. |
| 7,990,440 B2 | 8/2011 | Kobayashi et al. |
| 8,026,469 B2 | 9/2011 | Kochi |
| 8,120,681 B2 | 2/2012 | Ryoki et al. |
| 8,159,582 B2 | 4/2012 | Kato et al. |
| 8,169,525 B2 | 5/2012 | Ryoki et al. |
| 8,174,600 B2 | 5/2012 | Ogura et al. |
| 8,218,050 B2 | 7/2012 | Ogura et al. |
| 8,248,667 B2 | 8/2012 | Yoneda et al. |
| 8,416,473 B2 | 4/2013 | Yoneda et al. |
| 8,605,182 B2 | 12/2013 | Totsuka et al. |
| 8,710,558 B2 | 4/2014 | Inoue et al. |
| 8,872,092 B2 | 10/2014 | Ryoki et al. |
| 8,878,971 B2 | 11/2014 | Ryoki et al. |
| 8,957,364 B2 | 2/2015 | Ryoki et al. |
| 9,142,575 B2 | 9/2015 | Kobayashi et al. |
| 9,253,425 B2 | 2/2016 | Ryoki et al. |
| 9,426,398 B2* | 8/2016 | Ohshitanai .......... H04N 5/37213 |
| 9,560,285 B2 | 1/2017 | Ichikawa et al. |
| 9,608,025 B2 | 3/2017 | Ryoki |
| 2007/0165125 A1 | 7/2007 | Kochi |
| 2010/0002114 A1* | 1/2010 | Ogura .................... H04N 5/378 348/301 |
| 2010/0073573 A1* | 3/2010 | Yamaguchi .............. H04N 5/44 348/714 |
| 2017/0078603 A1 | 3/2017 | Yamasaki et al. |
| 2018/0175103 A1* | 6/2018 | Ryoki ............... H01L 27/14812 |
| 2018/0309946 A1* | 10/2018 | Ohya ................... H04N 5/3597 |
| 2018/0316881 A1* | 11/2018 | Arishima ............. H04N 5/3658 |

OTHER PUBLICATIONS

U.S. Appl. No. 15/620,972, filed Jun. 13, 2017. Applicant: Takanori Yamashita, et al.

U.S. Appl. No. 15/712,611, filed Sep. 22, 2017. Applicant: Daisuke Kobayashi.

U.S. Appl. No. 15/674,285, filed Aug. 10, 2017. Applicant: Kazuhiro Saito, et al.

* cited by examiner

IMAGING DEVICE, METHOD OF DRIVING IMAGING DEVICE, AND IMAGING SYSTEM

BACKGROUND OF THE INVENTION

Field of the Invention

The present invention relates to an imaging device, a method of driving imaging device, and an imaging system.

Description of the Related Art

In recent years, in CMOS image sensors, it has been proposed to capture an image by a global electronic shutter operation. The global electronic shutter operation is a driving method of capturing an image such that exposure periods are matched for a plurality of pixels, which has an advantage that, even when capturing object that is moving fast, the object image is less likely to be distorted.

Japanese Patent Application Laid-Open No. 2015-177349 discloses an imaging device including a global electronic shutter function. In the imaging device disclosed in Japanese Patent Application Laid-Open No. 2015-177349, charges of the next frame are accumulated in only a photoelectric converter during readout of a signal of the previous frame based on charges held in a charge holding portion, charges are accumulated in the photoelectric converter and the charge holding portion after the readout of the signal of the previous frame. Such a configuration of the imaging device enables an increase in the saturation charge amount of a pixel without enlarging the pixel area.

In an imaging device having a charge holding portion, however, despite the fact that the charge holding portion can be one of the noise sources, there is no consideration of a noise generated in the charge holding portion or the influence thereof in Japanese Patent Application Laid-Open No. 2015-177349. In order to acquire a better quality image, it is desirable to reduce noise components, which includes a noise generated in the charge holding portion, as much as possible that are likely to be superimposed on a pixel signal.

SUMMARY OF THE INVENTION

An object of the present invention is to provide an imaging device and an imaging system that can acquire a good quality image with suppressed noise or unevenness in a global electronic shutter operation.

According to one aspect of the present invention, there is provided an imaging device including a plurality of pixels, each of the plurality of pixels including a photoelectric converter that generates charges by photoelectric conversion, a holding portion that holds the charges transferred from the photoelectric converter, and an amplifier unit that outputs a signal based on the charges transferred from the holding portion, and an output line which is connected to the plurality of pixels and to which signals are output from the plurality of pixels, wherein each of the plurality of pixels is configured to output a signal based on charges generated by the photoelectric converter during an exposure period, the exposure period including a first period during which the photoelectric converter holds charges generated by the photoelectric converter in the first period and a second period during which the photoelectric converter or the holding portion holds charges generated by the photoelectric converter in the second period while the holding portion is holding charges generated in the first period, and wherein each of the plurality of pixels is further configured to reset the holding portion after outputting a signal based on charges held in the holding portion in the first period and before transferring charges generated in the first period from the photoelectric converter to the holding portion.

Further, according to another aspect of the present invention, there is provided a method of driving an imaging device including a plurality of pixels each including a photoelectric converter configured to generate charges by photoelectric conversion, a holding portion configured to hold the charges transferred from the photoelectric converter, and an amplifier unit configured to output a signal based on the charges transferred from the holding portion, and an output line which is connected to the plurality of pixels and to which signals are output from the plurality of pixels, wherein each of the plurality of pixels outputs a signal based on charges generated by the photoelectric converter during an exposure period, the exposure period including a first period during which the photoelectric converter holds charges generated by the photoelectric converter in the first period and a second period during which the photoelectric converter or the holding portion holds charges generated by the photoelectric converter in the second period while the holding portion is holding charges generated in the first period, the method including resetting the holding portion after outputting a signal based on charges held in the holding portion in the first period and before transferring charges generated in the first period from the photoelectric converter to the holding portion.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Embodiments of the present invention are of course not limited to the embodiments described below. For example, an example in which a part of the configuration of any of the embodiments below is added to another embodiment or an example in which a part of the configuration of any of the embodiments below is replaced with a part of the configuration of another embodiment is one of the embodiments of the present invention.

First Embodiment

Figure 1:
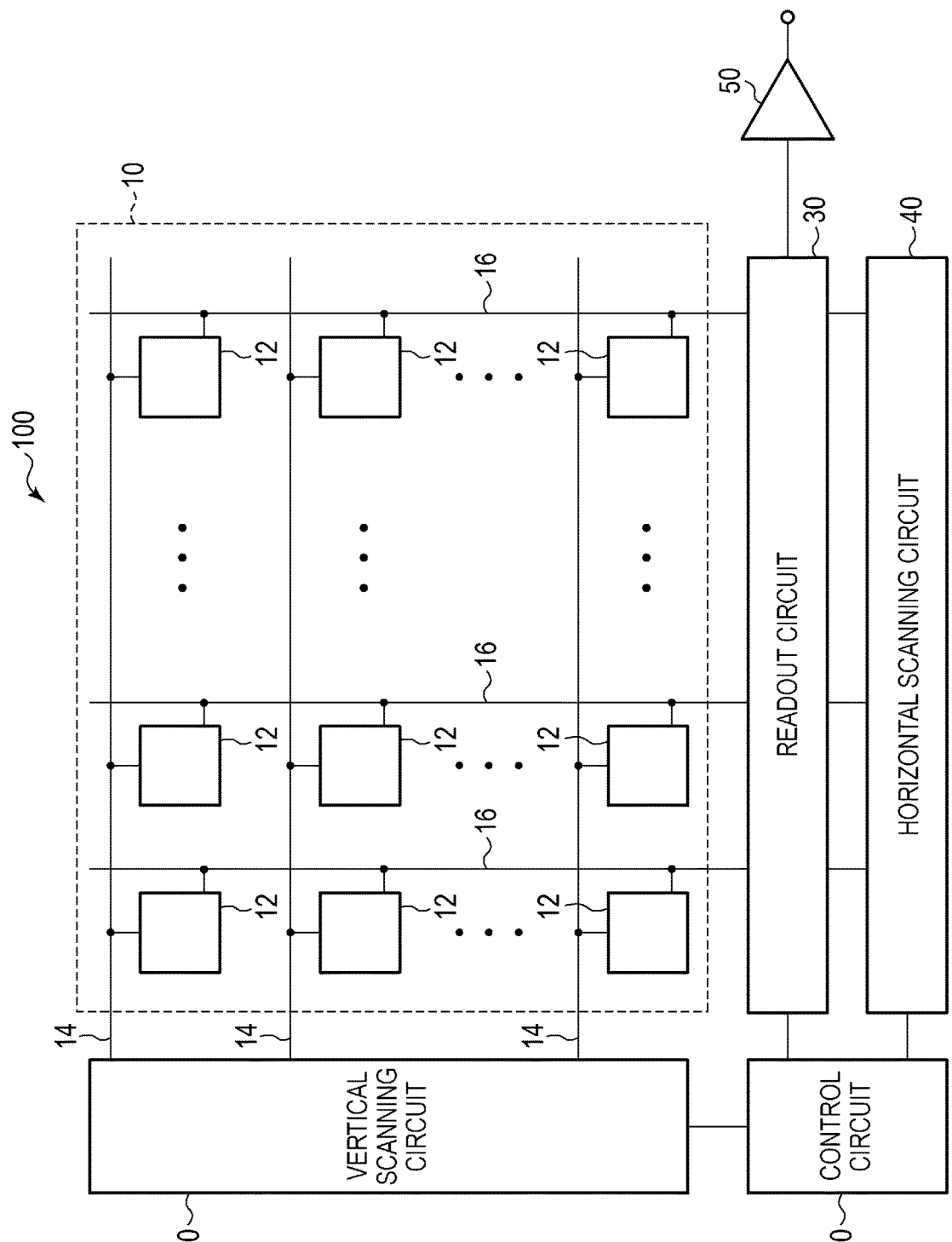
FIG. 1 is a block diagram illustrating a general configuration of an imaging device according to a first embodiment of the present invention.
Figure 2:
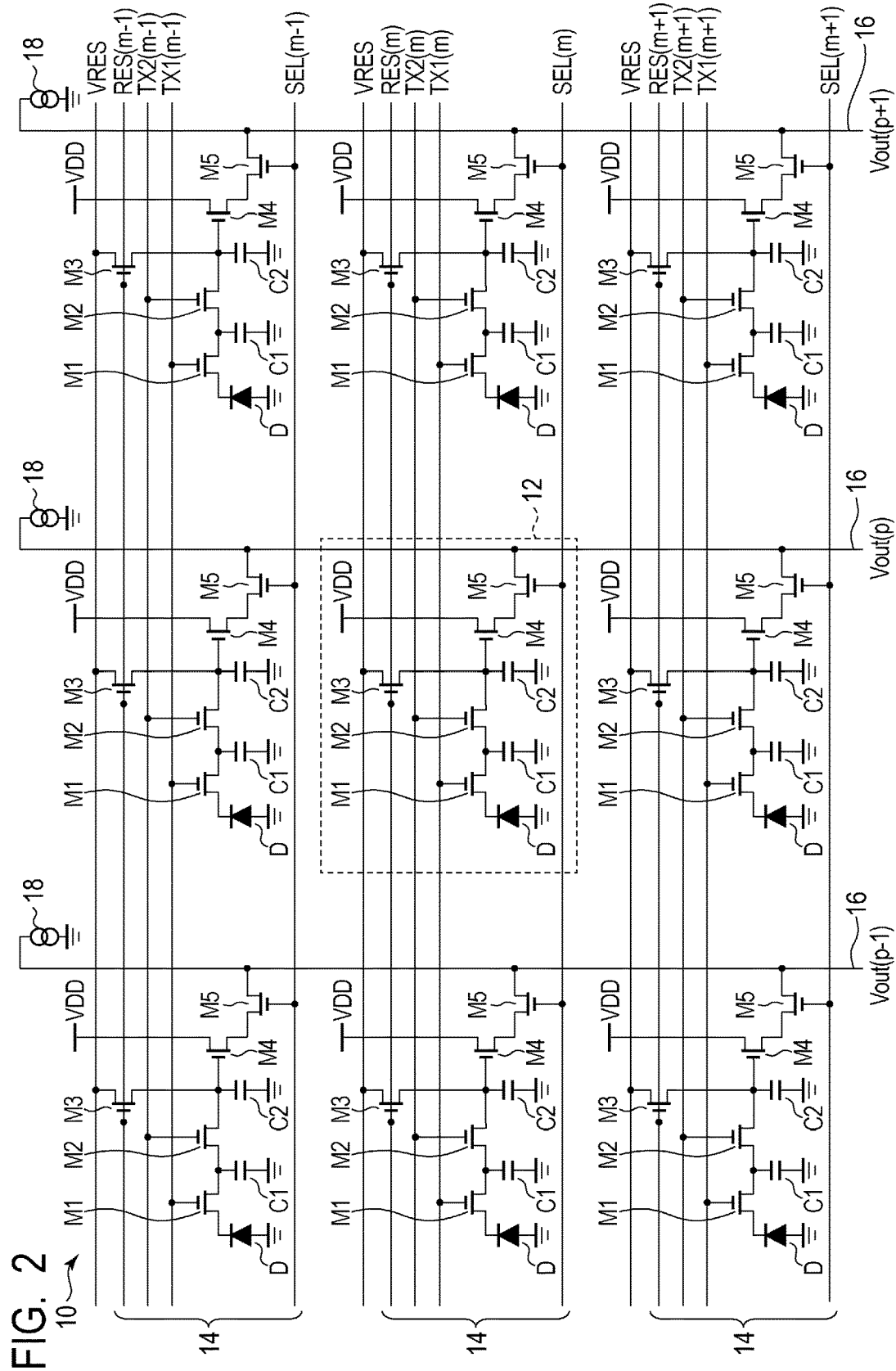
FIG. 2 is a circuit diagram illustrating an example configuration of pixels of the imaging device according to the first embodiment of the present invention.
Figure 3:
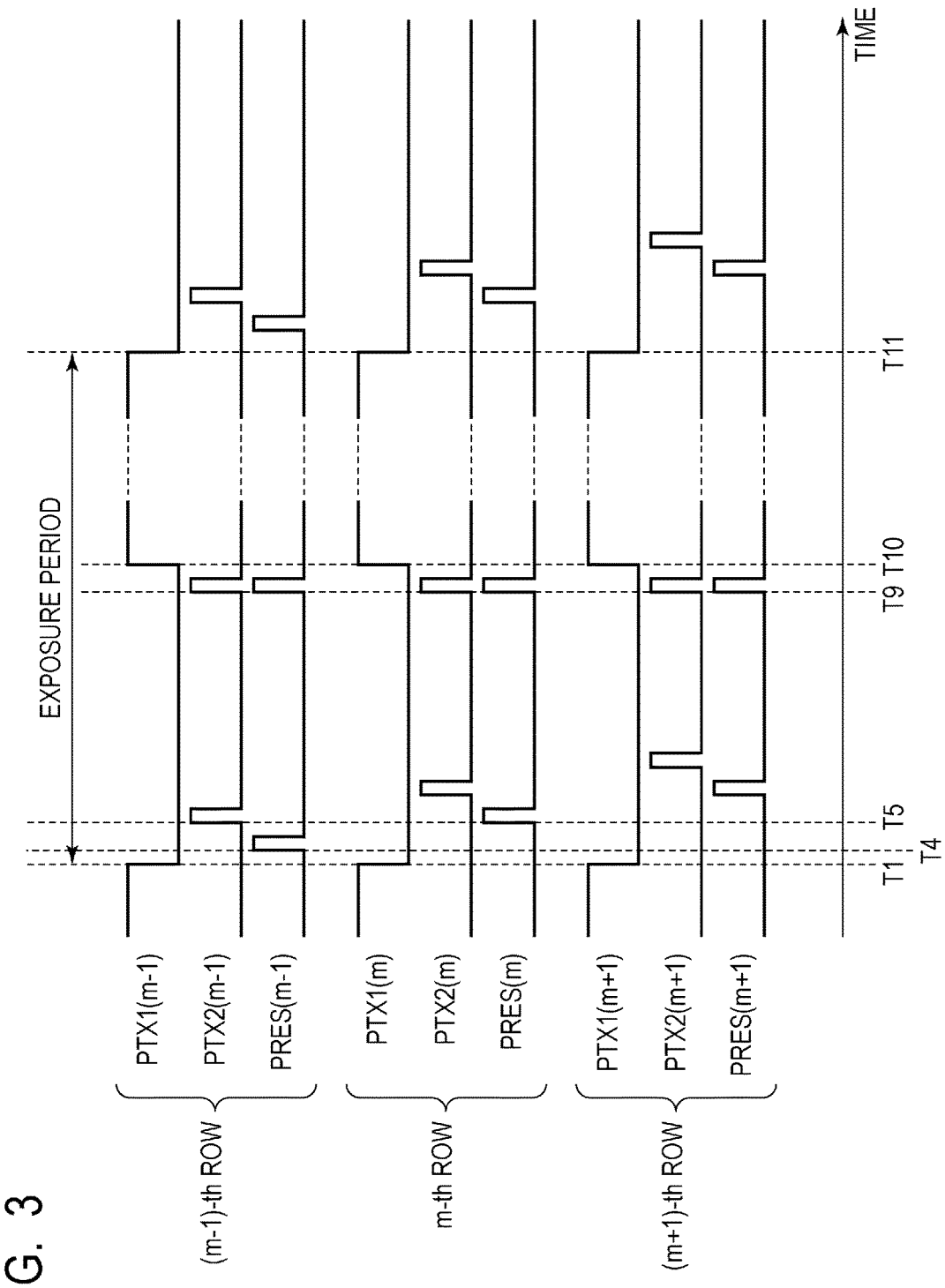
FIG. 3 and FIG. 4 are timing charts illustrating a method of driving the imaging device according to the first embodiment of the present invention.
Figure 4:
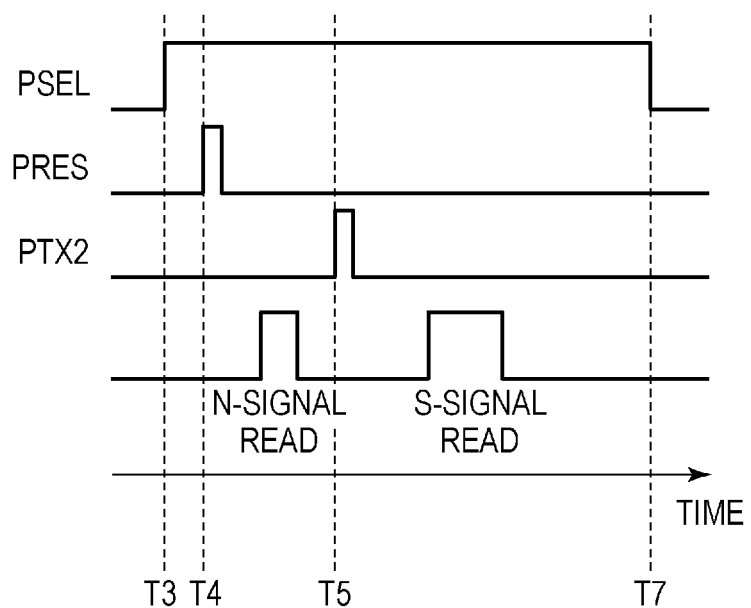

An imaging device and a method of driving the same according to a first embodiment of the present invention will be described with reference to FIG. 1 to FIG. 4. FIG. 1 is a block diagram illustrating a general configuration of the imaging device according to the present embodiment. FIG. 2 is a circuit diagram illustrating an example configuration of pixels of the imaging device according to the present embodiment. FIG. 3 and FIG. 4 are timing charts illustrating the method of driving the imaging device according to the present embodiment.

First, the configuration of the imaging device according to the present embodiment will be described by using FIG. 1 and FIG. 2 with respect to a CMOS image sensor as an example.

As illustrated in FIG. 1, an imaging device 100 according to the present embodiment includes a pixel array unit 10, a vertical scanning circuit 20, a readout circuit 30, a horizontal scanning circuit 40, an output circuit 50, and a control circuit 60.

The pixel array unit 10 is provided with a plurality of pixels 12 arranged over a plurality of rows and a plurality of columns. Each of the pixels 12 includes a photoelectric conversion element that converts an incident light into charges corresponding to the light amount.

The vertical scanning circuit 20 is a circuit unit that supplies, to the pixels 12, control signals for driving readout circuits in the pixels 12 via control signal lines 14 provided on a row basis of the pixel array when reading out signals from the respective pixels 12. Signals read out from the pixels 12 are input to the readout circuit 30 via output lines 16 provided on a column basis of the pixel array.

The readout circuit 30 is a circuit unit that performs a predetermined process, for example, signal processing such as an amplification process or an addition process on signals read out from the pixels 12. The readout circuit 30 may include, for example, column amplifiers, correlative double sampling (CDS) circuits, addition circuits, or the like. The readout circuit 30 may further include analog-to-digital (A/D) conversion circuits or the like if necessary.

The horizontal scanning circuit 40 is a circuit unit that supplies, to the readout circuit 30, control signals for sequentially transferring signals processed in the readout circuit 30 to the output circuit 50 on a column basis. The output circuit 50 is formed of a buffer amplifier, a differential amplifier, or the like, which is a circuit unit that amplifies a signal on a column selected by the horizontal scanning circuit 40 and outputs the amplified signal.

The control circuit 60 is a circuit unit that supplies, to the vertical scanning circuit 20, the readout circuit 30, and the horizontal scanning circuit 40, control signals for controlling the operation or the timing of these circuits. Some or all of the control signals supplied to the vertical scanning circuit 20, the readout circuit 30, and the horizontal scanning circuit 40 may be supplied from the outside of the imaging device 100.

FIG. 2 is a circuit diagram illustrating an example of pixel circuits forming the pixel array unit 10. Although FIG. 2 illustrates nine pixels 12 arranged in three rows by three columns out of the pixels 12 forming the pixel array unit 10, the number of the pixels 12 forming the pixel array unit 10 is not limited in particular.

Each of the plurality of pixels 12 includes a photoelectric converter D, transfer transistors M1 and M2, a reset transistor M3, an amplifier transistor M4, and a select transistor M5. The photoelectric converter D is a photodiode, for example. In the photodiode of the photoelectric converter D, the anode is connected to a ground voltage line, and the cathode is connected to the source of the transfer transistor M1. The drain of the transfer transistor M1 is connected to the source of the transfer transistor M2. A capacitance component parasitically coupled to the connection node of the drain of the transfer transistor M1 and the source of the transfer transistor M2 has a function as a charge holding portion. FIG. 2 depicts such the capacitance component as a capacitor (C1). This capacitor may be denoted as a holding portion C1 in the following description.

The drain of the transfer transistor M2 is connected with the source of the reset transistor M3 and the gate of the amplifier transistor M4. The connection node of the drain of the transfer transistor M2, the source of the reset transistor M3, and the gate of the amplifier transistor M4 is a so-called floating diffusion (FD) region. A capacitance component coupled to the FD region (floating diffusion capacitance) has a function as a holding portion of charges. FIG. 2 depicts this capacitance component as a capacitor (C2) connected to the FD region. The FD region may be denoted as a holding portion C2 in the following description. The drain of the reset transistor M3 is connected to a power source voltage line (VRES). The drain of the amplifier transistor M4 is connected to a power source voltage line (VDD). Note that the voltage (VRES) supplied to the drain of the reset transistor M3 and the voltage (VDD) supplied to the drain of the amplifier transistor M4 may be the same as each other or may be different from each other. The source of the amplifier transistor M4 is connected to the drain of the select transistor M5. The source of the select transistor M5 is connected to the output line 16.

The control signal lines 14 are arranged extending in the row direction (the horizontal direction in FIG. 2) for each row of the pixel array of the pixel array unit 10. The control signal lines 14 on each row include a control line TX1, a control line TX2, a control line RES, and a control line SEL. The control line TX1 is connected to the gates of the transfer transistors M1 of the pixels 12 aligned in the row direction, respectively, which is a signal line common to these pixels 12. The control line TX2 is connected to the gates of the transfer transistors M2 of the pixels 12 aligned in the row direction, respectively, which is a signal line common to these pixels 12. The control line RES is connected to the gates of the reset transistors M3 of the pixels 12 aligned in the row direction, respectively, which is a signal line common to these pixels 12. The control line SEL is connected to the gates of the select transistors M5 of the pixels 12 aligned in the row direction, respectively, which is a signal line common to these pixels 12. Note that, in FIG. 2, the name of each control line is appended with a corresponding row number (for example, TX1(m−1), TX1(m), TX1(m+1)).

The control lines TX1, the control lines TX2, the control lines RES, and the control lines SEL are connected to the vertical scanning circuit 20. A control signal PTX1 that is a drive pulse for controlling the transfer transistor M1 is output to the control line TX1 from the vertical scanning circuit 20. A control signal PTX2 that is a drive pulse for controlling the transfer transistor M2 is output to the control line TX2 from the vertical scanning circuit 20. A control signal PRES that is a drive pulse for controlling the reset transistor M3 is output to the control line RES from the vertical scanning circuit 20. A control signal PSEL that is a drive pulse for controlling the select transistor M5 is output to the control line SEL from the vertical scanning circuit 20. In a typical example, in response to a high level control signal being output from the vertical scanning circuit 20, the corresponding transistor is turned on and, in response to a low level control signal being output from the vertical scanning circuit 20, the corresponding transistor is turned off. The above control signals are supplied from the vertical scanning circuit 20 in accordance with predetermined timing signals from the control circuit 60. A logic circuit such as a shift resistor, an address decoder, or the like is used for the vertical scanning circuit 20.

The output lines 16 are arranged extending in the column direction (the vertical direction in FIG. 2) for respective rows of the pixel array of the pixel array unit 10. Each of the output lines 16 is connected to the sources of the select transistors M5 of the pixels 12 aligned in the column direction, which is a signal line common to these pixels 12. Note that the select transistors M5 of the pixels 12 may be omitted. In this case, the output line 16 is connected to the sources of the amplifier transistors M4. The output line 16 is connected with a current source 18.

The photoelectric converter D converts (photoelectrically converts) an incident light into charges of an amount in accordance with the light amount and accumulates the generated charges. The transfer transistor M1 transfers charges held in the photoelectric converter D to the holding portion C1. The holding portion C1 holds charges generated by the photoelectric converter D in a position different from the photoelectric converter D. The transfer transistor M2 transfers charges held in the holding portion C1 to the holding portion C2. The holding portion C2 holds charges transferred from the holding portion C1 and sets the voltage of the input node of an amplification portion (the gate of the amplifier transistor M4) to a voltage in accordance with the capacitance thereof and the amount of the transferred charges. The reset transistor M3 resets the holding portion C2 to a predetermined voltage in accordance with the voltage VRES. The select transistor M5 selects the pixel 12 from which a signal is output to the output line 16. The amplifier transistor M4 is configured such that the voltage VDD is supplied to the drain and a bias current is supplied to the source from the current source 18 via the select transistor M5, which forms an amplifier unit (a source follower circuit) in which the gate is the input node. Thereby, the amplifier transistor M4 outputs a signal Vout based on charges generated by an incident light to the output line 16. Note that, in FIG. 2, the signal Vout is appended with the corresponding column number (Vout(p−1), Vout(p), Vout(p+1)).

Such a configuration allows charges generated by the photoelectric converter D to be accumulated in the photoelectric converter D while the holding portion C1 is holding charges. This enables an image capturing operation such that exposure periods are matched among the plurality of pixels 12, namely, a so-called global electronic shutter operation. Note that electronic shutter means electrical control of accumulation of charges generated by an incident light.

Next, a method of driving the imaging device according to the present embodiment will be described by using FIG. 3 and FIG. 4. FIG. 3 is a timing chart illustrating the operation of the transfer transistors M1 and M2 and the reset transistors M3 in one frame period. FIG. 3 illustrates drive pulses for any three consecutive rows. FIG. 4 is a timing chart illustrating the readout operation of signals in one horizontal period.

In FIG. 3, the control signals PTX1 are control signals supplied to the gates of the transfer transistors M1. In FIG. 3 and FIG. 4, the control signals PTX2 are control signals supplied to the gates of the transfer transistors M2. In FIG. 3 and FIG. 4, the control signals PRES are control signals supplied to the gates of the reset transistors M3. In FIG. 4, the control signal PSEL is control signal supplied to the select transistor M5. Each of (m−1), (m), and (m+1) appended to the reference symbols of these control signals denotes a row number.

When each control signal illustrated in FIG. 3 and FIG. 4 is a high level, the corresponding transistor is in an on-state and, when each control signal illustrated in FIG. 3 and FIG. 4 is a low level, the corresponding transistor is in an off-state. Each control signal is supplied from the vertical scanning circuit 20 under the control of the control circuit 60.

In a period before the time T1, an accumulation operation of the previous frame is performed. Immediately before the time T1, the control signal PTX1 on each row is a high level, and the control signals PTX2 and PRES on each row are a low level.

At the time T1, the control signals PTX1 supplied from the vertical scanning circuit 20 to the control lines TX1 on all the rows are shifted from a high level to a low level to turn off the transfer transistors M1 of the pixels 12 on all the rows. Thereby, the exposure period of the previous frame ends. All the charges generated by the photoelectric converter D of each of the pixel 12 during the exposure period of the previous frame have been transferred to the holding portion C1 before the time T1. The time T1 is the end time of the exposure period of the previous frame and is also the start time of an exposure period of the next frame. Note that the control signals PTX1 are a low level until the time T10 described later to maintain the transfer transistors M1 in an off-state.

On and after the time T1, charges accumulated in the holding portions C1 of respective pixels 12 during the exposure period of the previous frame are sequentially transferred to the holding portions C2 from the holding portions C1 on a row basis. Thereby, each pixel signal based on the voltage of the input node of the amplifier unit (the gate of the amplifier transistor M4) in accordance with the amount of charges transferred to the holding portion C2 is output to the readout circuit 30 via the amplifier transistor M4, the select transistor M5, and the output line 16.

The readout operation of each row is performed according to the timing chart illustrated in FIG. 4, for example. In the operation in FIG. 4, selection of the pixel 12, reset, readout of a noise signal (N-signal read), transfer of charges from the holding portion C1 to the holding portion C2, and readout of an optical signal (S-signal read) are sequentially performed. FIG. 3 illustrates the control signals PRES and the control signals PTX2 out of the control signals illustrated in FIG. 4.

FIG. 4 depicts the time when readout is performed from the pixels 12 on the (m−1)-th row.

The readout operation of each row will now be described with respect to the readout operation from the pixels 12 on the (m−1)-th row illustrated in FIG. 3 as an example.

At the time t3 after the completion of the readout operation of the (m−2)-th row (not shown), the control signal PSEL(m−1) (not shown) supplied to the control line SEL (m−1) from the vertical scanning circuit 20 is shifted from a low level to a high level. Thereby, the select transistors M5 of the pixels 12 on the (m−1)-th row are turned on, and the pixels 12 on the (m−1)-th row are in a selected state.

Subsequently, at the time T4, the control signal PRES(m−1) supplied to the control line RES(m−1) from the vertical scanning circuit 20 is shifted from a low level to a high level, and the reset transistors M3 of the pixels 12 on the (m−1)-th row are turned on. Thereby, the holding portions C2 of the pixels 12 on the (m−1)-th row are reset to a predetermined voltage in accordance with the voltage VRES.

Subsequently, after the control signal PRES(m−1) is shifted from a high level to a low level, each pixel signal (noise signal) based on the reset voltage of each of the holding portions C2 is output to the readout circuit 30 via the amplifier transistor M4, the select transistor M5, and the output line 16 (N-signal read).

Subsequently, at the time T5 after noise signals are read out, the control signal PTX2(m−1) supplied to the control line TX2(m−1) from the vertical scanning circuit 20 is shifted from a low level to a high level. Thereby, the transfer transistors M2 are turned on, and charges which have been held in each of the holding portions C1 of the pixels 12 on the (m−1)-th row are transferred to each of the holding portions C2.

Subsequently, after the control signal PTX2(m−1) is shifted from a high level to a low level, each pixel signal (optical signal) based on each amount of charges transferred to the holding portion C2 is output to the readout circuit 30 via the amplifier transistor M4, the select transistor M5, and the output line 16 (S-signal read). Note that only an optical signal may be read out from the pixel 12 without a noise signal being read out.

Subsequently, at the time T7, the control signal PSEL(m−1) is shifted from a high level to a low level, the select transistors M5 of the pixels 12 on the (m−1)-th row are turned off, and thereby selection of the pixels 12 on the (m−1)-th row is released.

The analog signal output from the pixel 12 via the output line 16 is output to the outside of the imaging device via the output circuit 50. The signal read out from the pixel 12 may be output after an AD conversion process is performed inside the imaging device (for example, the readout circuit 30), or may be output to the outside of the imaging device as an analog signal and then an AD conversion process may be performed.

In such a way, the same readout operation is performed for all the rows, and pixel signals based on charges accumulated during the exposure period of the previous frame are sequentially output to the readout circuit 30 from the pixels 12 on a row basis.

After pixel signals of the pixels 12 on all the rows are read out, at the time T9, the control signals PTX2 and the control signals PRES on all the rows are shifted from a low level to a high level to turn on the transfer transistors M2 and the reset transistors M3. Thereby, the holding portions C1 are reset to a predetermined voltage in accordance with the voltage VRES via the transfer transistors M2 and the reset transistors M3.

Subsequently, after the control signals PTX2 and the control signals PRES on all the rows are shifted from a high level to a low level to release the reset of the holding portions C1, the control signals PTX1 on all the rows are shifted from a low level to a high level in a period from the time T10 to the time T11. Thereby, charges accumulated in the photoelectric converters D in a period from the time T1. to the time T11 are transferred from the photoelectric converters D to the holding portions C1. That is, charges generated in the photoelectric converters D are accumulated in only the photoelectric converters D in the period from the time T1. to the time T10 and accumulated in the photoelectric converters D and the holding portions C1 in the period from the time T10 to the time T11.

Note that reset operations of the holding portions C1 are not necessarily required to be performed simultaneously at the time T9 for all the rows, but may be performed in any period on a row basis as long as it is a period after the end of readout and before the time T10 when the control signals PTX1 become a high level (see a third embodiment). It is desirable to perform reset of the holding portions C1 immediately before the time T10 when charges are transferred from the photoelectric converters D to the holding portions C1.

As discussed above, in the driving method of the present embodiment, at the time T9 after signals based on charges held in the holding portions C1 are read out, the transfer transistors M2 and the reset transistors M3 are turned on to reset the holding portions C1 to a predetermined voltage from the holding portions C2 side. Then, charges accumulated in the photoelectric converters D are transferred to the holding portions C1. In such a way, by resetting the holding portions C1 before charges are transferred from the photoelectric converters D to the holding portions C1, it is possible to remove a noise component generated in the holding portions C1 in a period from the time T1 to the time T9 due to a dark current, for example, and further improve the image quality.

Therefore, according to the present embodiment, a good quality image with suppressed noise can be acquired in global electronic shutter driving.

Second Embodiment

An imaging device and a method of driving the same according to a second embodiment of the present invention will be described with reference to FIG. 5 to FIG. 8. The same component as that of the imaging device according to the first embodiment is labeled with the same reference symbol, and the description thereof will be omitted or simplified.

Figure 5:
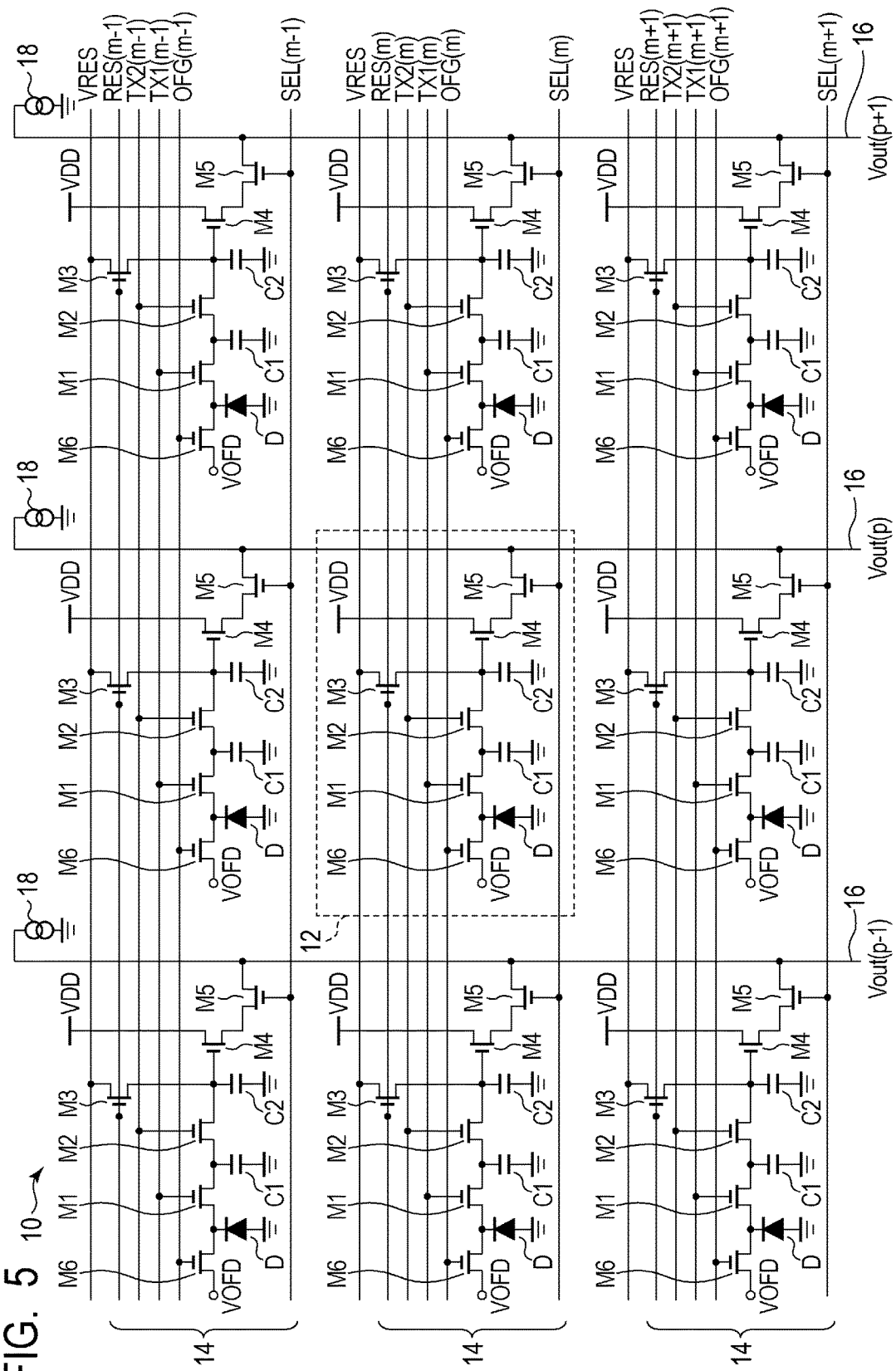
FIG. 5 is a circuit diagram illustrating an example configuration of pixels of an imaging device according to a second embodiment of the present invention.
Figure 6:
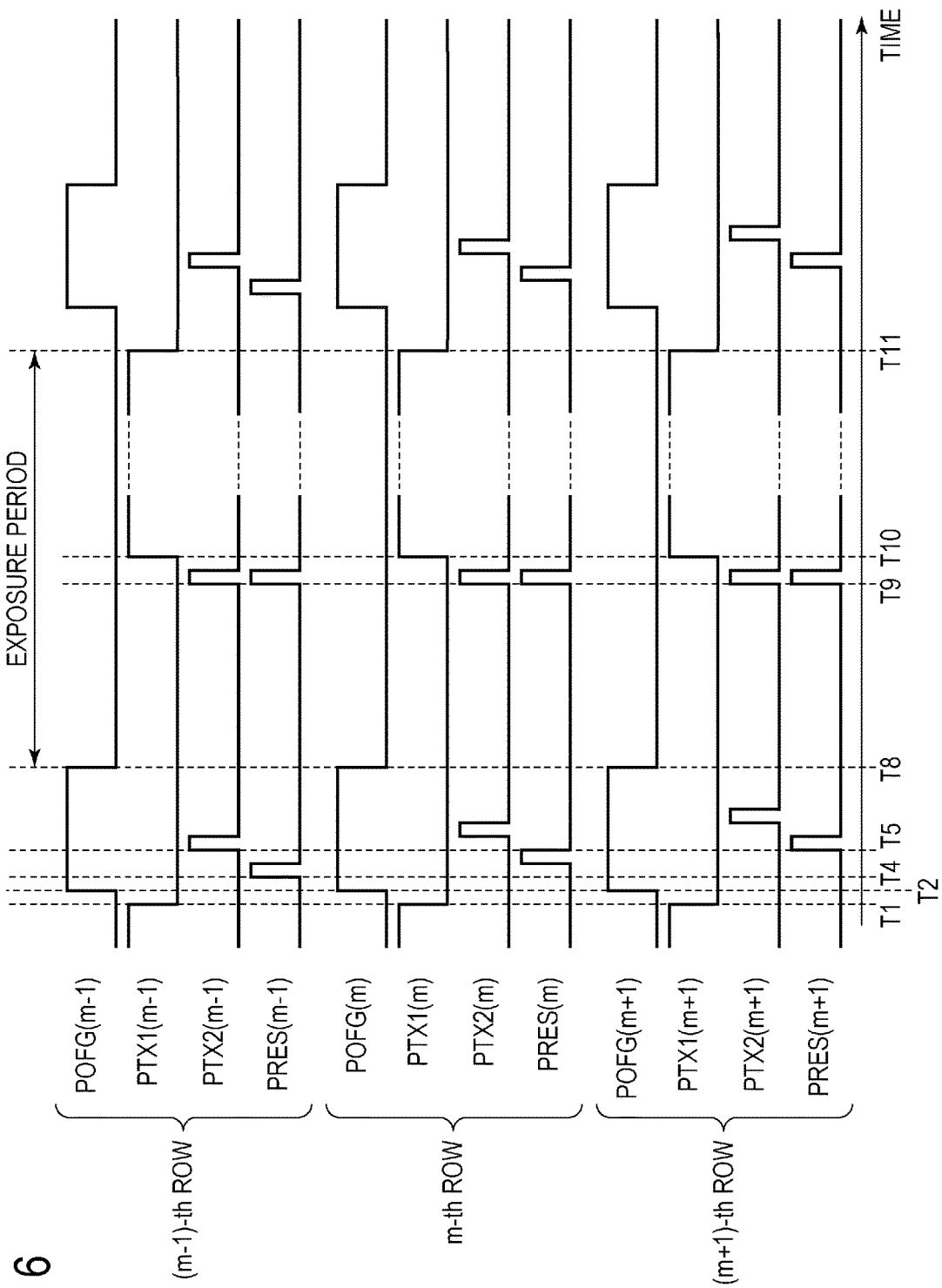
FIG. 6 is a timing chart illustrating a method of driving the imaging device according to the second embodiment of the present invention.
Figure 7:
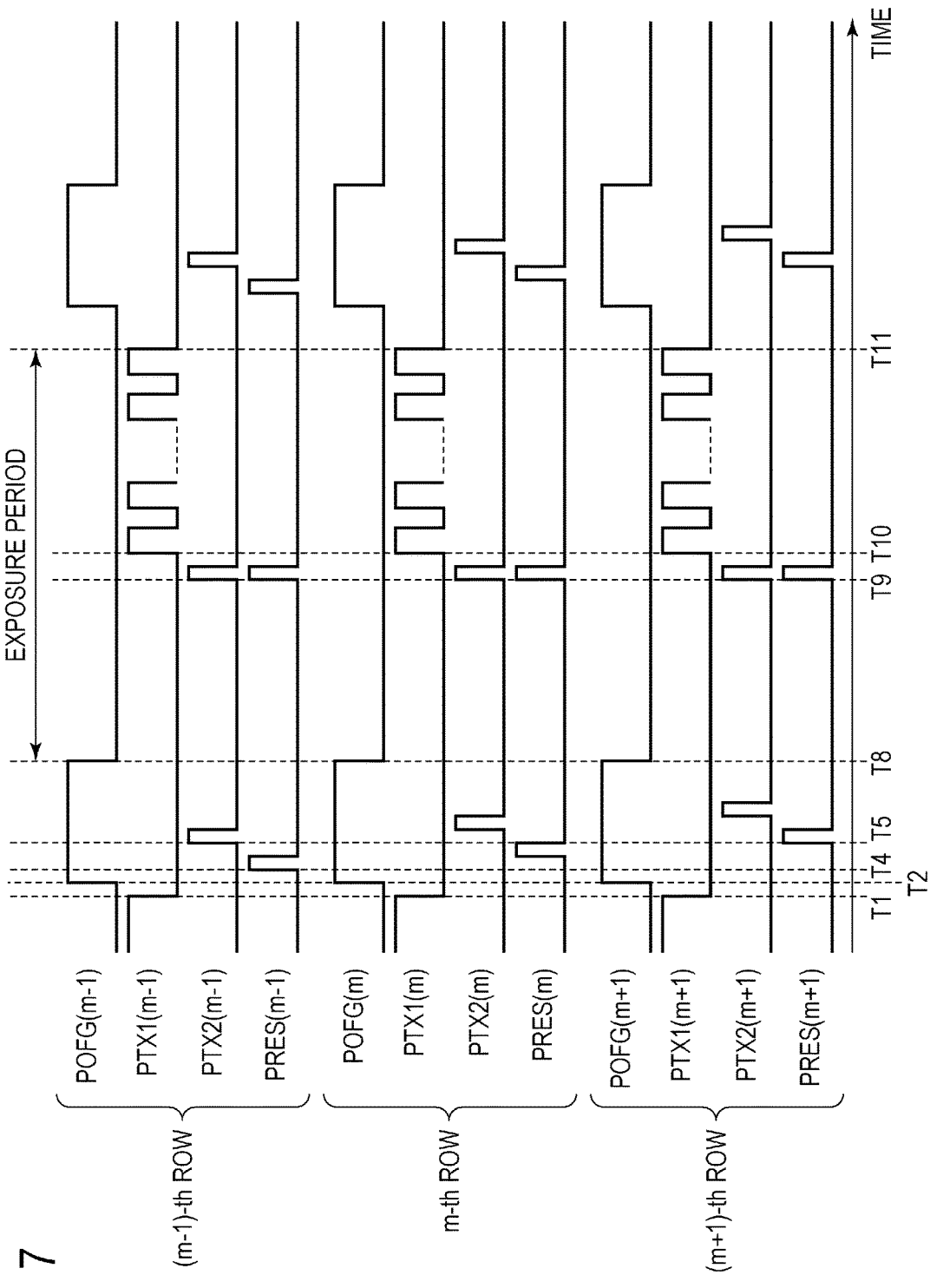
FIG. 7 is a timing chart illustrating a method of driving an imaging device according to a modified example of the second embodiment of the present invention.
Figure 8:
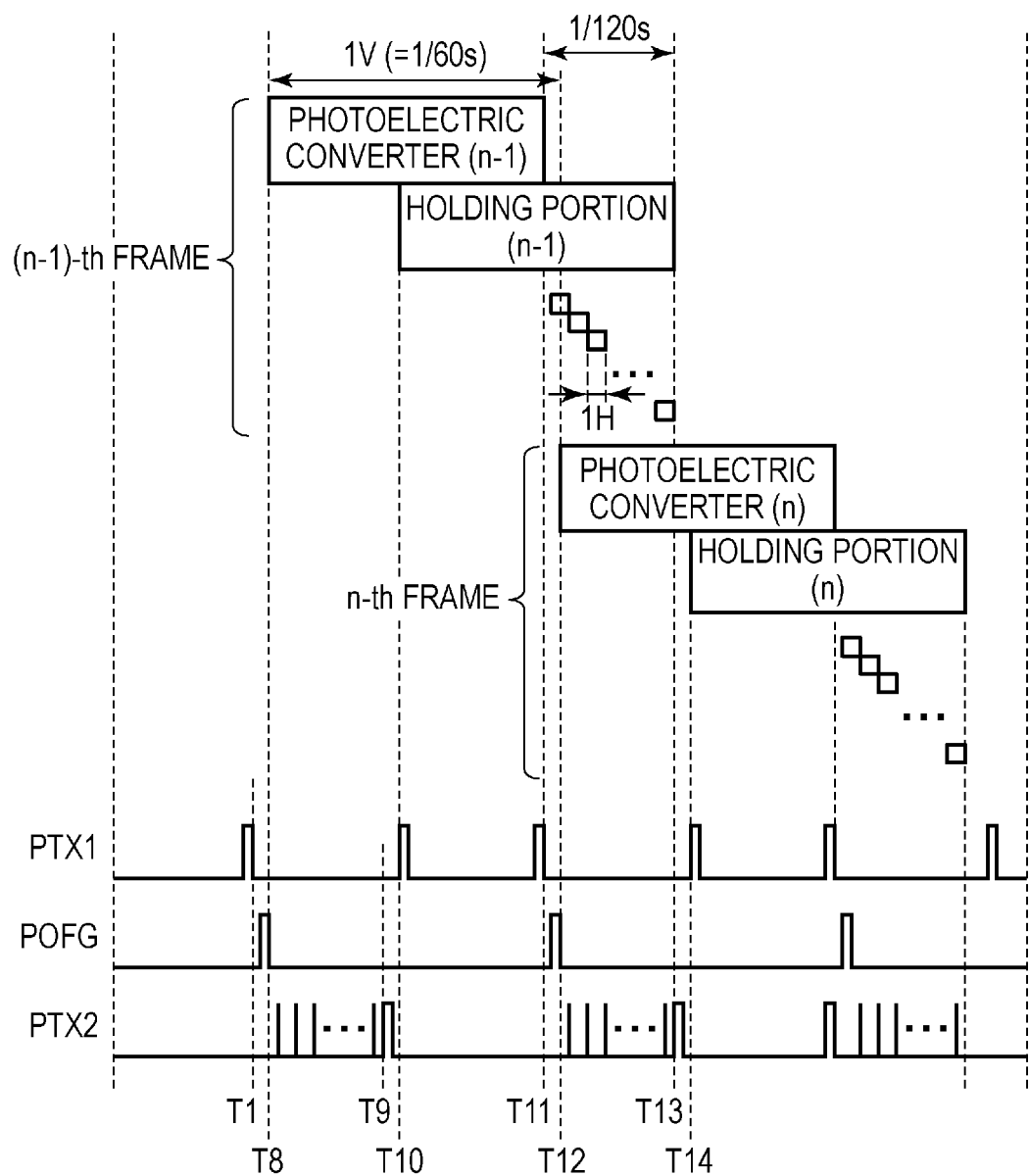
FIG. 8 is a diagram schematically illustrating the operation of the imaging device according to the second embodiment of the present invention.

FIG. 5 is a circuit diagram illustrating an example configuration of pixels of the imaging device according to the present embodiment. FIG. 6 is a timing chart illustrating a method of driving the imaging device according to the present embodiment. FIG. 7 is a timing chart illustrating a method of driving the imaging device according to a modified example of the present embodiment. FIG. 8 is a diagram schematically illustrating the operation of the imaging device according to the present embodiment.

First, the configuration of the imaging device according to the present embodiment will be described by using FIG. 5.

The imaging device according to the present embodiment is different from the imaging device according to the first embodiment in that each of the pixels 12 further includes a charge-draining transistor M6, as illustrated in FIG. 5.

The source of the charge-draining transistor M6 is connected to the connection node of the cathode of the photodiode of the photoelectric converter D and the source of the transfer transistor M1. The drain of the charge-draining transistor M6 is connected to a power source voltage line (VOFD). The charge-draining transistor M6 is responsible for draining charges accumulated in the photoelectric converter D to a power source node such as an overflow drain (the power source voltage line VOFD in this example). Note that the voltage (VOFD) supplied to the drain of the charge-draining transistor M6 and the voltage VDD or the voltage VRES may be the same as each other or may be different from each other.

The control signal line 14 arranged on each row of the pixel array of the pixel array unit 10 further includes a control line OFG. The control lines OFG are connected to the gates of the charge-draining transistors M6 of the pixels 12 aligned in the row direction, respectively, and is a signal line common to these pixels 12. The control lines OFG are connected to the vertical scanning circuit 20. A control signal POFG that is a drive pulse for controlling the charge-draining transistor M6 is output to each of the control lines OFG from the vertical scanning circuit 20. In a typical example, in response to a high level control signal POFG being output from the vertical scanning circuit 20, the corresponding charge-draining transistor M6 is turned on and, in response to a low level control signal POFG being output from the vertical scanning circuit 20, the corresponding charge-draining transistor M6 is turned off.

In the first embodiment, the start time of an exposure period is controlled by a timing at which the transfer transistor M1 is switched from an on-state to an off-state. In contrast, in the pixel configuration in which the charge-draining transistor M6 is provided in connection with the photoelectric converter D as described in the present embodiment, it is possible to control the start time or the end time of an exposure period by using the drive timing of the charge-draining transistor M6. Specifically, charges generated by the photoelectric converter D are drained during an on-state period of the charge-draining transistor M6, and charges generated by the photoelectric converter D are accumulated during an off-state period of the charge-draining transistor M6. Therefore, controlling the operation of the charge-draining transistor M6 allows for an improved flexibility of setting of an exposure period.

Next, a method of driving the imaging device according to the present embodiment will be described by using FIG. 6. FIG. 6 is a timing chart illustrating the operation of the charge-draining transistors M6, the transfer transistors M1 and M2, and the reset transistors M3 in one frame period.

FIG. 6 illustrates drive pulses for any three consecutive rows. In FIG. 6, the control signals POFG are control signals supplied to the gates of the charge-draining transistors M6. When each control signal illustrated in FIG. 6 is a high level, the corresponding transistor is in an on-state and, when each control signal illustrated in FIG. 6 is a low level, the corresponding transistor is in an off-state. Each control signal is supplied from the vertical scanning circuit 20 under the control of the control circuit 60.

In a period before the time T1, an accumulation operation of the previous frame is performed. Immediately before the time T1, the control signal PTX1 on each row is a high level, and the control signals POFG, PTX2, and PRES on each row are a low level.

At the time T1, the control signals PTX1 supplied from the vertical scanning circuit 20 to the control lines TX1 on all the rows are shifted from a high level to a low level to turn off the transfer transistors M1 of the pixels 12 on all the rows. Thereby, the exposure period of the previous frame ends. All the charges generated by the photoelectric converter D of each of the pixel 12 during the exposure period of the previous frame have been transferred to the holding portion C1 before the time T1. The time T1. is the end time of the exposure period of the previous frame.

At the subsequent time T2, the control signals POFG supplied from the vertical scanning circuit 20 to the control lines OFG on all the rows are shifted from a low level to a high level to turn on the charge-draining transistors M6 of the pixels 12 on all the rows. Thereby, charges that have been accumulated in the photoelectric converters D are drained via the charge-draining transistors M6. The control signals POFG are maintained to a high level during a period from the time T2 to the time T8. Charges generated by the photoelectric converters D during this period are also drained via the charge-draining transistors M6 without being accumulated in the photoelectric converters D. In the present embodiment, accumulation of charges in the photoelectric converters D starts from the time T8 when the control signals POFG become a low level. The time T8 is the start time of an exposure period of the next frame.

Further, on and after the time T1, the readout operations from the pixels 12 on each row are sequentially performed on a row basis in the same manner as the first embodiment.

After signals are read out from the pixels 12 on all the rows, at the time T9, the control signals PTX2 and the control signals PRES on all the rows are shifted from a low level to a high level to turn on the transfer transistors M2 and the reset transistors M3. Thereby, the holding portions C1 are reset to a predetermined voltage in accordance with the voltage VRES via the transfer transistors M2 and the reset transistors M3.

Subsequently, after the control signals PTX2 and the control signals PRES on all the rows are shifted from a high level to a low level to release the reset of the holding portions C1, the control signals PTX1 on all the rows are shifted from a low level to a high level in a period from the time T10 to the time T11. Thereby, charges accumulated in the photoelectric converters D in a period from the time T8 to the time T11 are transferred from the photoelectric converters D to the holding portions C1. That is, charges generated in the photoelectric converters D are accumulated in only the photoelectric converters D in the period from the time T8 to the time T10 and accumulated in the photoelectric converters D and the holding portions C1 in the period from the time T10 to the time T11. The control signals PTX1 become a low level at the time T11 and thereby the exposure period ends, and charges generated by the photoelectric converters D during a period from the time T8 to the time T11 will be held in the holding portions C1.

Note that reset operations of the holding portions C1 are not necessarily required to be performed simultaneously at the time T9 for all the rows, but may be performed in any period on a row basis as long as it is a period after the end of readout and before the time T10 when the control signals PTX1 become a high level. It is desirable to perform reset of the holding portions C1 immediately before the time T10 when charges are transferred from the photoelectric converters D to the holding portions C1.

When a global electronic shutter operation is performed in the driving described above, at least the timing at which the control signals POFG become a low level (the time T8 in this example) and the timing at which the control signals PTX1 become a low level (the time T11 in this example) are set to the same for all the rows.

As described above, the timing at which the control signals POFG become a low level (the time T8 in this example) defines the start time of an exposure period and can be set to any timing in accordance with a desired exposure period. Further, the control signals POFG are driven at the same timing on all the rows when a global electronic shutter operation is performed. Thus, the time T8 in FIG. 6, that is, the timing at which the control signals POFG become a low level may overlap with a readout period of signals from the pixels 12 on a part of the rows. In such a case, since the driving of the control signals POFG is simultaneous on all the rows, a voltage such as the power source voltage or the ground voltage may vary due to the driving of the control signals POFG in a certain size of the pixel array and affect the signals of the pixels 12 during readout. It is therefore desirable that the timing of a falling edge of the control signal POFG (the time T8) be adjusted so as not to occur in a readout period such as an analog operation period including the timing of the S-signal read, for example.

Note that, although the control signals PTX1 are maintained to a high level during a period from the time T10 to the time T11 in the example driving illustrated in FIG. 6, the control signals PTX1 may be driven by multiple times in a divided manner as illustrated in an example driving illustrated in FIG. 7, for example. In this case, charges are accumulated in only the photoelectric converters D during a period in which the control signals PTX1 are a low level, and charges are accumulated in the photoelectric converters D and the holding portions C1 during a period in which the control signals PTX1 are a high level. Also in the present example driving, the holding portions C1 and C2 can be reset to a predetermined voltage at the time T9 before the timing at which the control signals PTX1 first become a high level (the time T10).

As discussed above, in a driving method of the present embodiment, at the time T9 after signals based on charges held in the holding portions C1 are read out, the transfer transistors M2 and the reset transistors M3 are turned on, and the holding portions C1 are reset to a predetermined voltage from the holding portions C2 side. Then, charges accumulated in the photoelectric converters D are transferred to the holding portions C1. In such a way, by resetting the holding portions C1 before charges are transferred from the photoelectric converters D to the holding portions C1, it is possible to remove a noise component generated in the holding portions C1 due to, for example, a dark current in a period from the time T8 to the time T9, and further improve the image quality.

Therefore, according to the present embodiment, a good quality image with suppressed noise can be acquired in global electronic shutter driving.

More specific operation of the imaging device according to the present embodiment will be described using FIG. 8. FIG. 8 schematically illustrates the operation in the (n−1)-th frame and the n-th frame. Each time corresponding to the time T1 to the time T11 in FIG. 6 and FIG. 7 is provided with the same reference symbol in FIG. 8. Note that, although an operation of acquiring an image for 60 frames per second (the frame rate is 1/60 seconds) is assumed and described here, the frame rate is not limited in particular.

At the time T8, the control signal POFG is controlled from a high level to a low level, thereby, reset of the photoelectric converters D is released on all the rows at the same time, and accumulation of charges in the (n−1)-th frame is started. Further, at the time T12, the control signal POFG is controlled from a high level to a low level, reset of the photoelectric converters D is released on all the rows at the same time, and accumulation of charges in the n-th frame is started. In the present embodiment, the period from the time T8 to the time T12 is 1/60 seconds corresponding to one frame period.

At the time T9 before the timing of transfer of charges from the photoelectric converter D to the holding portion C1, the control signal PTX2 together with the control signal PRES (not shown) is shifted from a low level to a high level to reset the holding portion C1.

Transfer of charges from the photoelectric converter D to the holding portion C1 is performed at the timing of a drive pulse of the control signal PTX1 rising at the time T10 and at the timing of a drive pulse of the control signal PTX1 falling down at the time T11. This example driving corresponds to a case where the control signal PTX1 is driven twice between the time T10 and the time T11 in the timing chart of FIG. 7.

Charges generated by the photoelectric converter D in the (n−1)-th frame are accumulated in the photoelectric converter D in the period from the time T8 to the time T11 and accumulated in the holding portion C1 in the period from the time T10 to the time T13. Charges generated by the photoelectric converter D are therefore accumulated in the photoelectric converter D and the holding portion C1 in the period from the T10 to the time T11. Note that the time T13 is the time of the n-th frame corresponding to the time T9 of the (n−1)-th frame.

In this example driving, the timing of the drive pulse of the control signal PTX1 rising at the time T10 is set around the middle of an exposure period defined by the interval between the time T8 and the time T11. Since charges accumulated in the photoelectric converter D in the period from the time T8 to the time T10 are transferred to the holding portion C1 at the time T10, the charge amount that can be accumulated in the photoelectric converter D (the saturation charge amount) can be any amount such as approximately half the saturation charge amount of the pixel 12, that is, the saturation charge amount of the holding portion C1.

Therefore, with application of the present configuration, the area of the photoelectric converter D can be approximately half the area of the holding portion C1, which allows for a reduction in the area of the pixel 12. With the period from the time T8 to the time T10 being shorter than the period from the time T10 to the time tT11, the saturation charge amount of the photoelectric converter D can be further reduced. Note that, in a period from the time T3 to the time T4, the control signal PTX1 may be fixed to a high level as the example driving illustrated in FIG. 6, for example.

On and after the time T12, an accumulation operation of the n-th frame is started in the photoelectric converter D. Charges generated by the photoelectric converter D are accumulated in only the photoelectric converter D until the time T14 when the control signal PTX1 next becomes a high level.

In the period from the time T11 to the time T13, the control signal PTX2 is controlled to sequentially read out signals of the (n−1)-th frame on a row basis. The readout period for a signal of the (n−1)-th frame is a period in which charges of the n-th frame are accumulated in only the photoelectric converter D and is half the one frame period, that is, 1/120 seconds in this example driving. After the completion of the signal readout operation on all the rows, reset of the holding portion C1 is performed at the time T13 and the control signal PTX1 is turned to a high level at the time T14, and thereby charges of the n-th frame are transferred to the holding portion C1.

In such a way, by controlling the number of transfer times and the readout time of charges to the holding portion C1, it is possible to improve the saturation charge amount of the pixel 12 and minimize the layout area. The reset operation of the holding portion C1 can be performed before the timing of the first transfer of charges from the photoelectric converter D to the holding portion C1, that is, at the time T9 before the time T10 in the present example driving.

Third Embodiment

An imaging device and a method of driving the same according to a third embodiment of the present invention will be described with reference to FIG. 9 to FIG. 11. The same component as that of the imaging device according to the first and second embodiments is labeled with the same reference symbol, and the description thereof will be omitted or simplified.

Figure 9:
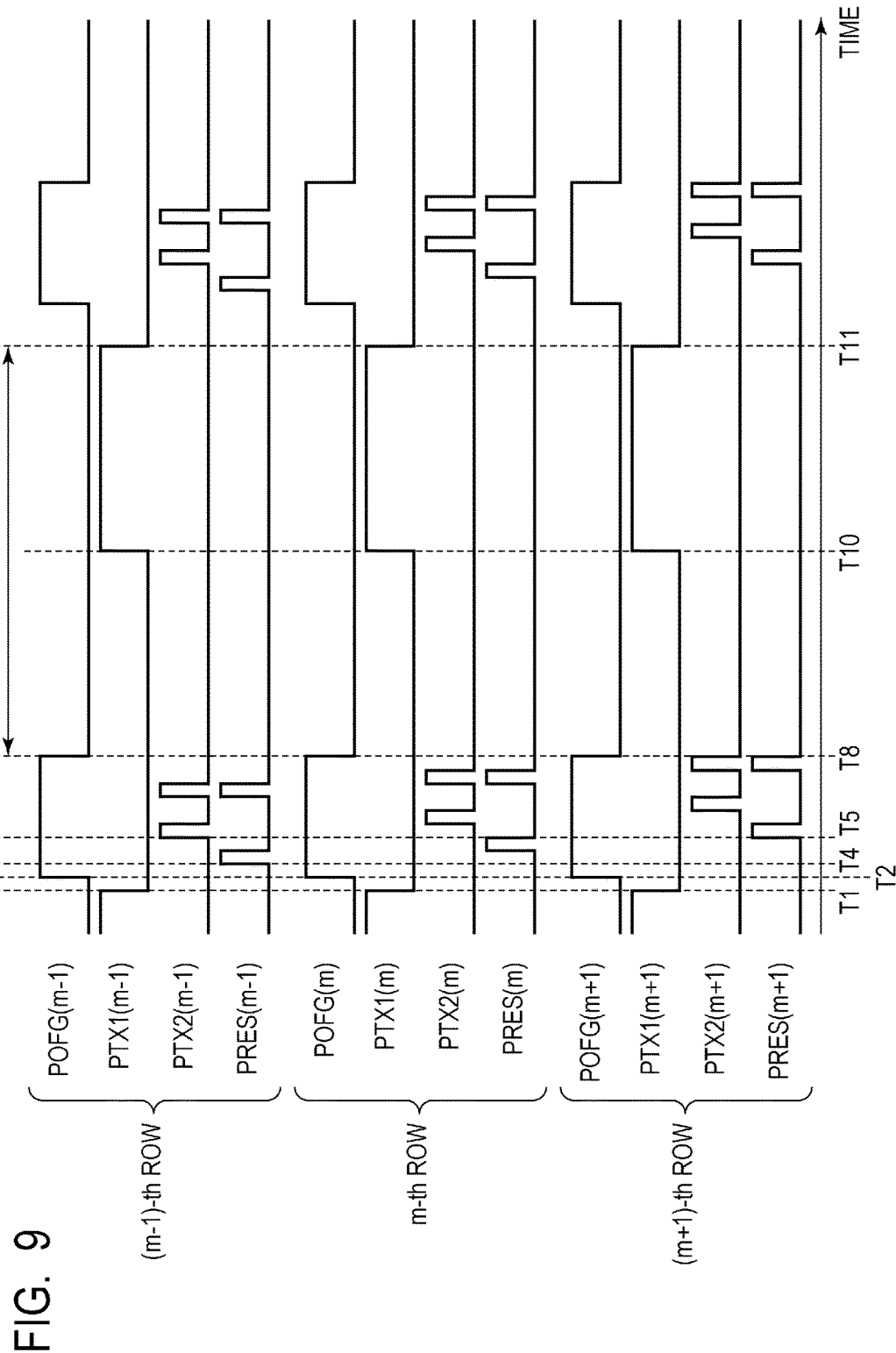
FIG. 9 and FIG. 10 are timing charts illustrating a method of driving the imaging device according to a third embodiment of the present invention.
Figure 10:
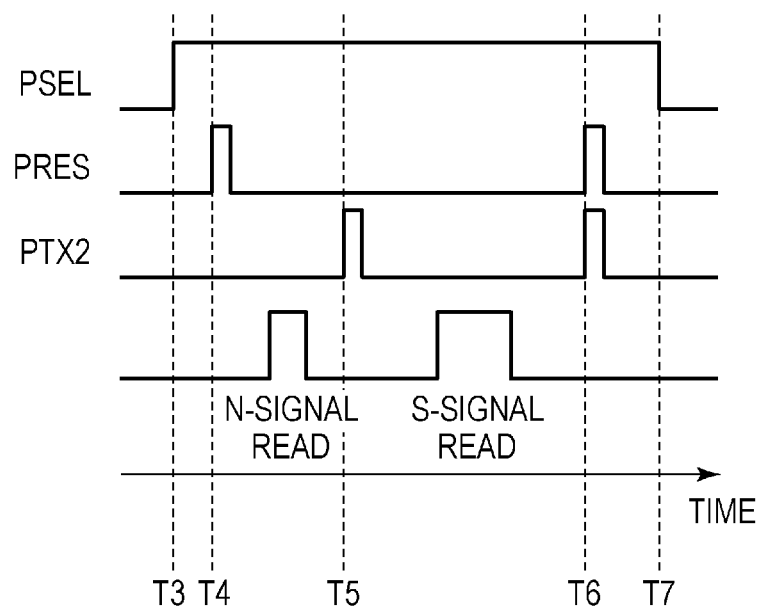

FIG. 9 and FIG. 10 are timing charts illustrating a method of driving the imaging device according to the present embodiment. FIG. 11 is a timing chart illustrating a method of driving the imaging device according to a modified example of the present embodiment.

In the present embodiment, another method of driving the imaging device according to the second embodiment will be described. The method of driving the imaging device according to the present embodiment is different from the method of driving the imaging device according to the second embodiment in the timing of performing reset of the holding portions C1.

That is, the driving method of the present embodiment is different from the driving method of the second embodiment in that the reset operation of the holding portions C1 performed by the control signals PTX2 and the control signals PRES are performed on a row basis after the end of the signal readout operation as illustrated in FIG. 9.

In the driving method of the present embodiment, readout operation on each row is performed according to the timing chart illustrated in FIG. 10, for example. In FIG. 10, the control signal PSEL is a control signal supplied to the select transistor M5. The control signal PRES is a control signal supplied to the reset transistor M3. The control signal PTX2 is a control signal supplied to the transfer transistor M2. In the operation of FIG. 10, selection of the pixel 12, reset, readout of a noise signal (N-signal read), transfer of charges from the holding portion C1 to the holding portion C2, readout of an optical signal (S-signal read), and reset of the holding portion C1 are sequentially performed. That is, in the driving method of the present embodiment, readout of a signal and reset of the holding portion C1 are performed in one horizontal period.

As discussed above, in the driving method of the present embodiment, after an optical signal is read out in the same manner as the readout operation illustrated in FIG. 4 and before selection of the pixel 12 is released at the time T7, reset of the holding portion C1 is performed via the holding portion C2 at the time T6. The reset operation of the holding portion C1 performed at the time T6 is the same as the reset operation of the holding portion C1 performed at the time T9 in the driving method of the second embodiment except that it is performed on only the pixels 12 on selected rows instead of all the rows at once.

By the operation described above, readout operations of signals and reset operations of the holding portions C1 are sequentially performed on all the rows, and accumulation operations of signals on and after the time T8 are then started in the same manner as the second embodiment.

Figure 11:
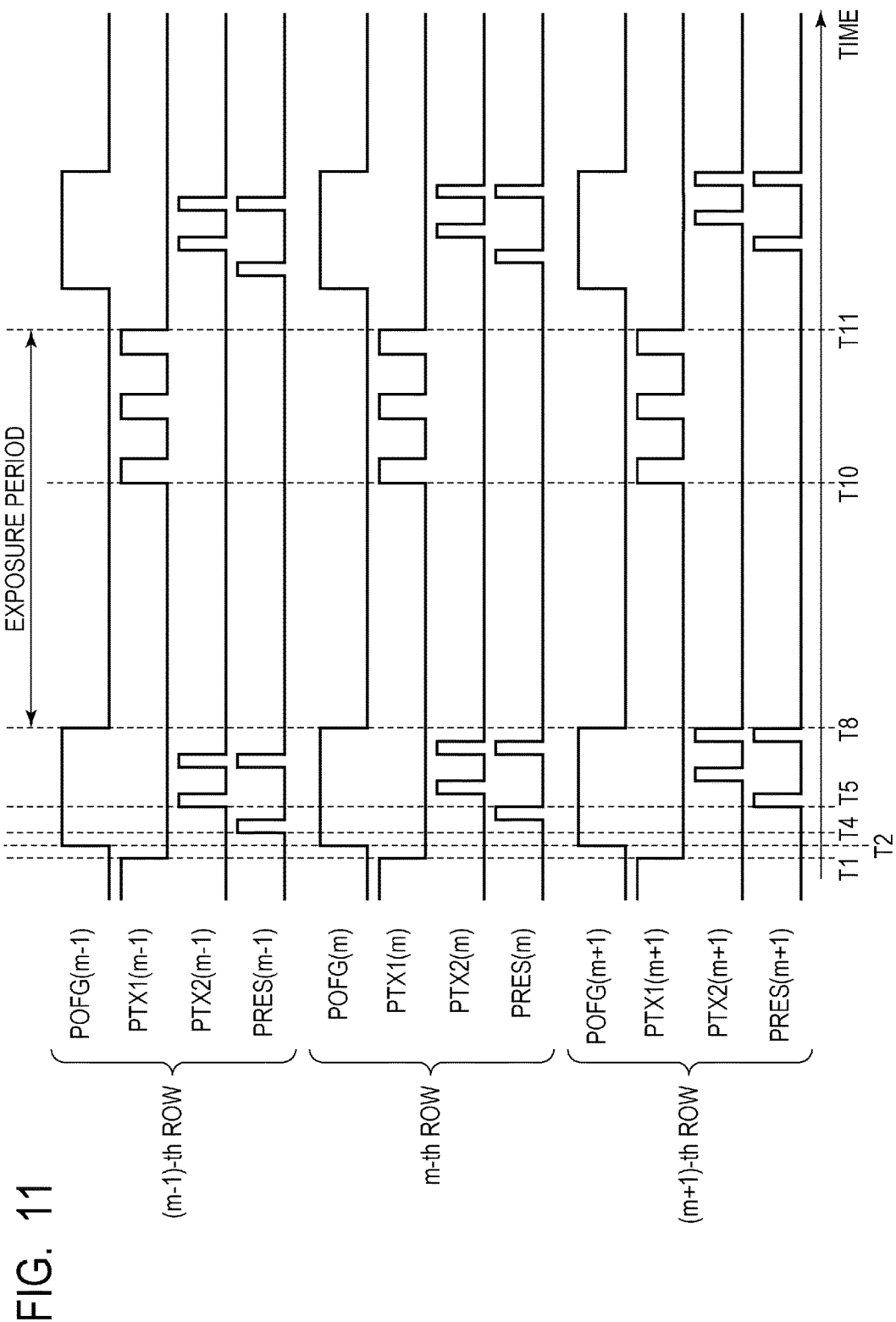
FIG. 11 is a timing chart illustrating a method of driving an imaging device according to a modified example of the third embodiment of the present invention.

Also in the driving method of the present embodiment, the control signals PTX1 may be driven by multiple times in a period from the time T10 to the time T11 as illustrated in FIG. 11, for example, in the same manner as the second embodiment. In this case, charges are accumulated in only the photoelectric converters D during a period in which the control signals PTX1 are a low level, and charges are accumulated in the photoelectric converters D and the holding portions C1 during a period in which the control signals PTX1 are a high level. Also in this example driving, the holding portions C1 and C2 can be reset to a predetermined voltage at the time T6 before the timing at which the control signals PTX1 first become a high level (the time T10).

According to the driving method of the present embodiment, the period from the time when the holding portion C1 is reset to the time when the control signal PTX2 is driven to read out a signal from the holding portion C1 is substantially the same for each row. Thus, even when a noise such as a dark current, for example, occurs in the holding portion C1, the amount of the generated noise is substantially the same in each row, which can suppress occurrence of an unevenness within a screen.

As discussed above, according to the present embodiment, a good quality image with suppressed noise or unevenness can be acquired in global electronic shutter driving.

Fourth Embodiment

Figure 12:
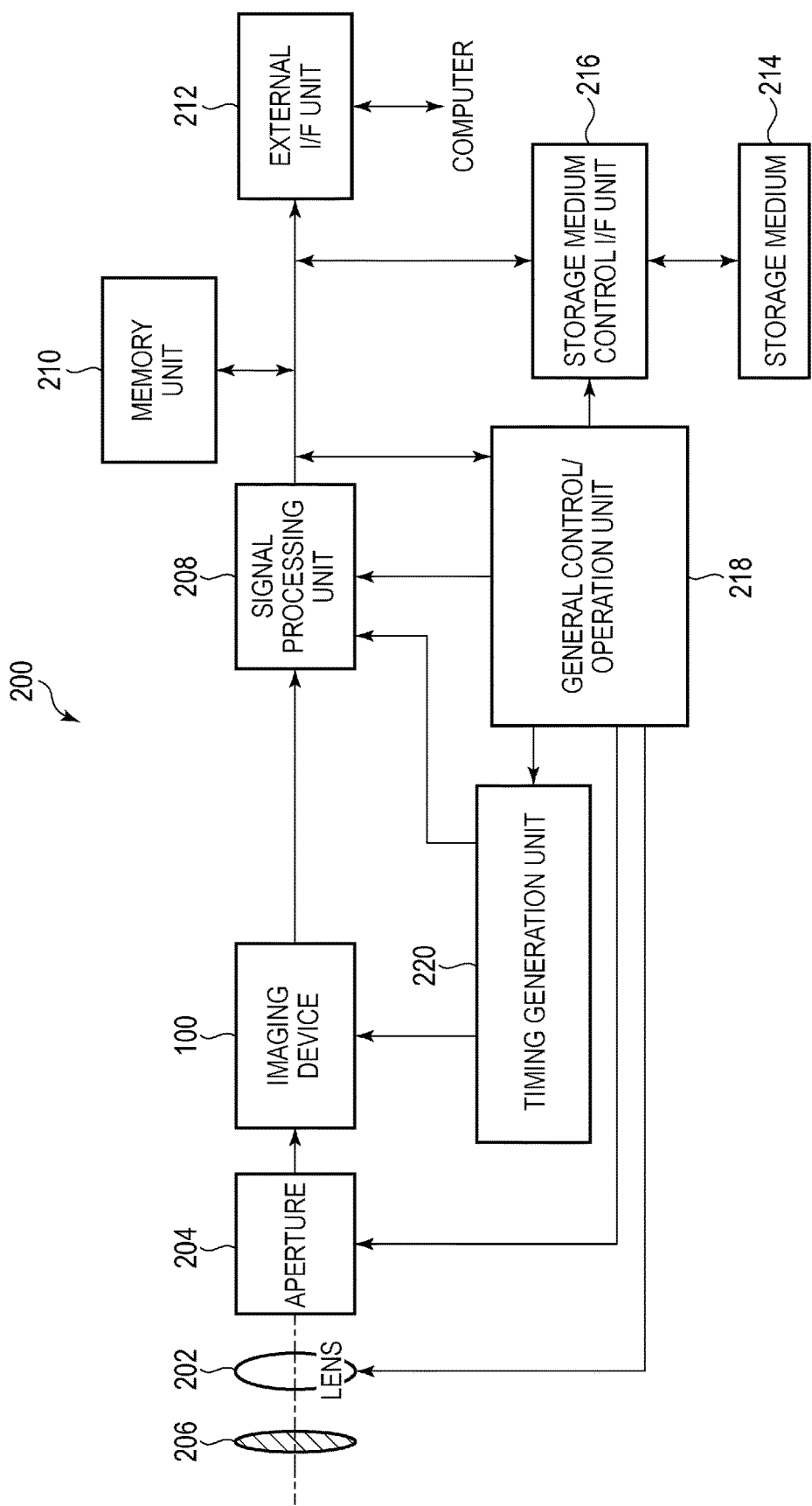
FIG. 12 is a block diagram illustrating a general configuration of an imaging system according to a fourth embodiment of the present invention.

An imaging system according to a fourth embodiment of the present invention will be described with reference to FIG. 12. The same component as that of the imaging device according to the first to third embodiments is labeled with the same reference symbol, and the description thereof will be omitted or simplified. FIG. 12 is a block diagram illustrating a configuration of the imaging system according to the present embodiment.

The imaging devices 100 described in the above first to the third embodiments can be applied to various imaging systems. Examples of the applicable imaging systems may include a digital still camera, a digital camcorder, a surveillance camera, a copier machine, a facsimile machine, a mobile phone, an on-vehicle camera, an observation satellite, and the like. Further, a camera module having an optical system, such as a lens, and an imaging device may be included in the imaging system. FIG. 12 illustrates a block diagram of a digital still camera as an example of the above.

The imaging system 200 illustrated as an example in FIG. 12 includes the imaging device 100, a lens 202 that captures an optical image of an object onto the imaging device 100, an aperture 204 for changing a light amount passing through the lens 202, and a barrier 206 for protecting the lens 202. The lens 202 and the aperture 204 form an optical system that converges a light onto the imaging device 100. The imaging device 100 is any of the imaging devices 100 described in the first to third embodiments and converts an optical image captured by the lens 202 into image data.

The imaging system 200 further includes a signal processing unit 208 that processes an output signal output from the imaging device 100. The signal processing unit 208 performs AD conversion that converts an analog signal output from the imaging device 100 into a digital signal. Further, the signal processing unit 208 performs other operations of performing various correction or compression if necessary and outputting image data. An AD conversion unit that is a part of the signal processing unit 208 may be formed on the semiconductor substrate in which the imaging device 100 is provided, or may be formed on a different semiconductor substrate from the imaging device 100. Further, the imaging device 100 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of image pickup data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various computation and controls the entire digital still camera and a timing generation unit 220 that outputs various timing signals to the imaging device 100 and the signal processing unit 208. Here, the timing signal or the like may be input from the outside, and the imaging system 200 may include at least the imaging device 100 and the signal processing unit 208 that processes an output signal output from the imaging device 100.

The imaging device 100 outputs an imaging signal to the signal processing unit 208. The signal processing unit 208 performs predetermined signal processing on an imaging signal output from the imaging device 100 and outputs image data. The signal processing unit 208 uses an imaging signal to generate an image.

Application of the imaging device 100 of any of the first to third embodiments can realize an imaging system that can acquire a good quality image with less noise or unevenness in global electronic shutter driving.

Fifth Embodiment

Figure 13A:
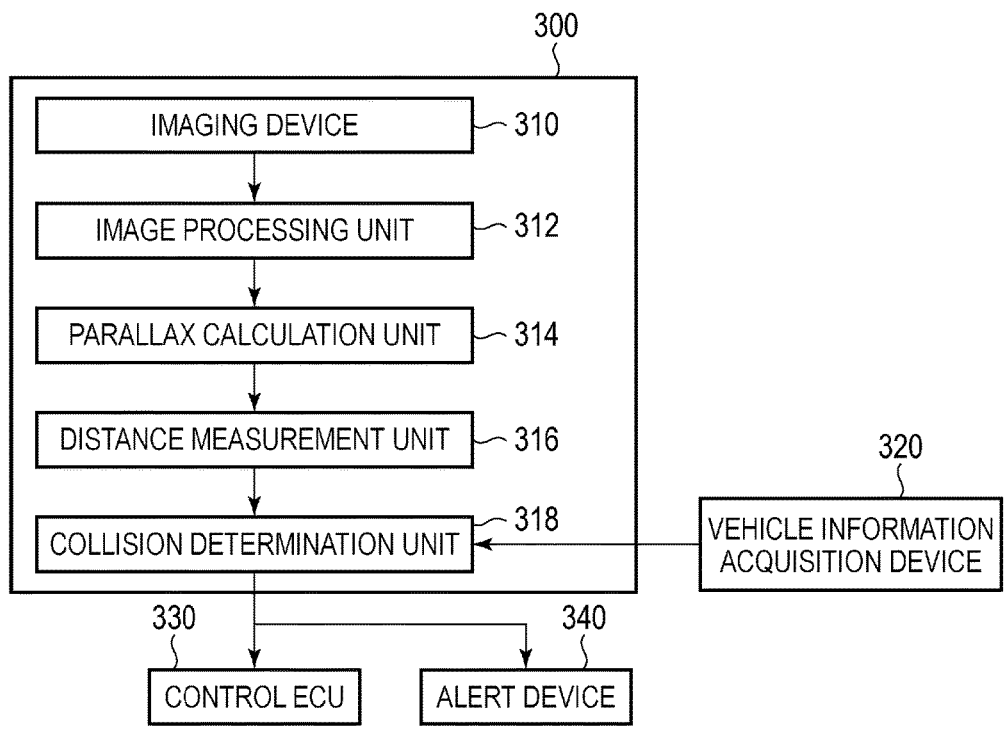
FIG. 13A is a diagram illustrating an example configuration of an imaging system according to a fifth embodiment of the present invention.
Figure 13B:
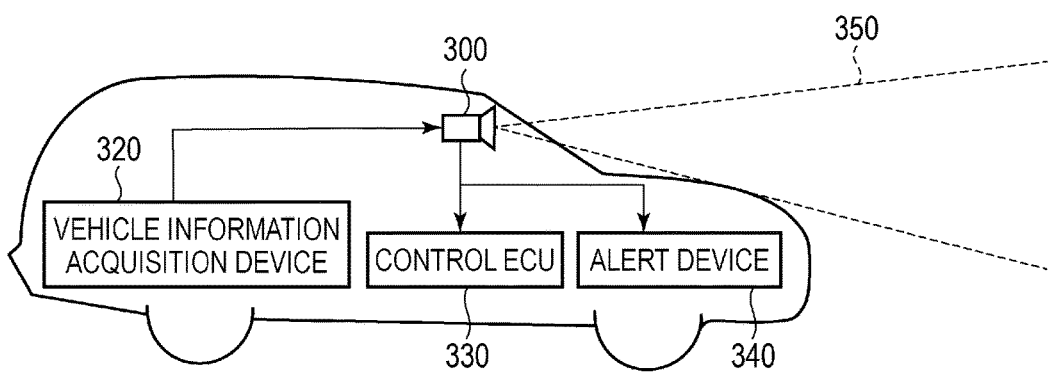
FIG. 13B is a diagram illustrating an example configuration of a movable object according to the fifth embodiment of the present invention.

An imaging system and a movable object according to a fifth embodiment of the present invention will be described with reference to FIG. 13A and FIG. 13B. FIG. 13A is a diagram illustrating a configuration of the imaging system according to the present embodiment. FIG. 13B is a diagram illustrating a configuration of the movable object according to the present embodiment.

FIG. 13A illustrates an example of an imaging system related to an on-vehicle camera. The imaging system 300 includes an imaging device 310. The imaging device 310 is any of the imaging devices 100 described in the above first to third embodiments. The imaging system 300 includes an image processing unit 312 that performs image processing on a plurality of image data acquired by the imaging device 310 and a parallax calculation unit 314 that calculates a parallax (a phase difference of parallax images) from the plurality of image data acquired by the imaging system 300. Further, the imaging system 300 includes a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying brake, pushing back an accelerator, suppressing engine power, or the like. The alert device 340 alerts a user by sounding an alert such as a sound, displaying alert information on a display of a car navigation system or the like, providing vibration to seat belt or a steering wheel, or the like.

In the present embodiment, an area around a vehicle, for example, a front area or a rear area is captured by using the imaging system 300. FIG. 13B illustrates the imaging system in a case of capturing a front area of a vehicle (a capturing area 350). The vehicle information acquisition device 320 transmits instructions to the imaging system 300 or the imaging device 310 to perform the operation described in the above first to third embodiments. Since the operation of the imaging device 310 is the same as that in the first to third embodiments, the description thereof is omitted here. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, although the case where the imaging device is driven by global electronic shutter has been described in the above-described embodiments, the present invention can be applied to a case where the imaging device is driven by rolling electronic shutter as well.

Further, although the case where signals are read out from pixels on all the rows of a pixel array has been described as an example in the above embodiments, it is not always necessary to read out signals from all the pixels on all the rows. The number of signals output from the pixel array may be changed in accordance with the format of the output image. For example, in capturing a motion image, signals corresponding to the number of horizontal lines used for one frame may be output. In such an embodiment, signals are not required to be output from all the pixels included in the imaging device.

Further, the imaging system illustrated in the fourth and fifth embodiments are an example of imaging systems to which the imaging device of the present invention may be applied, the imaging system to which the imaging device of the present invention can be applied is not limited to the configuration illustrated in FIG. 12, FIG. 13A and FIG. 13B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-243111, filed Dec. 15, 2016, which is hereby incorporated by reference herein in its entirety.

What is claimed is:

1. An imaging device comprising:
a plurality of pixels, each of the plurality of pixels including a photoelectric converter that generates charges by photoelectric conversion, a holding portion that holds the charges transferred from the photoelectric converter, and an amplifier unit that outputs a signal based on the charges transferred from the holding portion; and
an output line which is connected to the plurality of pixels and to which signals are output from the plurality of pixels,
wherein each of the plurality of pixels is configured to output a signal based on charges generated by the photoelectric converter during an exposure period, the exposure period including
a first period during which the photoelectric converter holds charges generated by the photoelectric converter in the first period and
a second period during which the photoelectric converter or the holding portion holds charges generated by the photoelectric converter in the second period while the holding portion is holding charges generated in the first period, and
wherein each of the plurality of pixels is further configured to reset the holding portion after outputting a signal based on charges held in the holding portion in the first period and before transferring charges generated in the first period from the photoelectric converter to the holding portion.

2. The imaging device according to claim 1,
wherein, in the first period, output of the signal based on the charges transferred to the amplifier unit is performed sequentially for the plurality of pixels, and
wherein reset of the holding portion is performed simultaneously in the plurality of pixels.

3. The imaging device according to claim 1, wherein, in the first period, output of the signal based on the charges transferred to the amplifier unit and reset of the holding portion are performed sequentially for the plurality of pixels.

4. The imaging device according to claim 1, wherein the exposure period is the same for the plurality of pixels.

5. The imaging device according to claim 1, wherein each of the plurality of pixels further includes a first transfer transistor that transfers charges of the photoelectric converter to the holding portion, a second transfer transistor that transfers charges of the holding portion to the amplifier unit, and a reset unit that resets charges transferred to the amplifier unit.

6. The imaging device according to claim 5, wherein reset of the holding portion in the first period is performed via the second transfer transistor by using the reset unit.

7. The imaging device according to claim 5, wherein the first transfer transistor is maintained to an off-state during the first period.

8. The imaging device according to claim 5, wherein the first transfer transistor is turned on multiple times during the second period.

9. The imaging device according to claim 1,
wherein each of the plurality of pixels further includes a charge-draining transistor that drains charges of the photoelectric converter, and
wherein a start time of the exposure period is defined by a timing at which the charge-draining transistor is turned off.

10. A method of driving an imaging device including a plurality of pixels each including a photoelectric converter configured to generate charges by photoelectric conversion, a holding portion configured to hold the charges transferred from the photoelectric converter, and an amplifier unit configured to output a signal based on the charges transferred from the holding portion, and an output line which is connected to the plurality of pixels and to which signals are output from the plurality of pixels, wherein each of the plurality of pixels outputs a signal based on charges generated by the photoelectric converter during an exposure period, the exposure period including a first period during which the photoelectric converter holds charges generated by the photoelectric converter in the first period and a second period during which the photoelectric converter or the holding portion holds charges generated by the photoelectric converter in the second period while the holding portion is holding charges generated in the first period, the method comprising:
resetting the holding portion after outputting a signal based on charges held in the holding portion in the first period and before transferring charges generated in the first period from the photoelectric converter to the holding portion.

11. The method of driving the imaging device according to claim 10,
wherein, in the first period, output of the signal based on the charges transferred to the amplifier unit is performed sequentially for the plurality of pixels, and
wherein reset of the holding portion in the first period is performed simultaneously in the plurality of pixels.

12. The method of driving the imaging device according to claim 10, wherein, in the first period, output of the signal based on the charges transferred to the amplifier unit and reset of the holding portion are performed sequentially for the plurality of pixels.

13. The method of driving the imaging device according to claim 10, wherein the exposure period is the same for the plurality of pixels.

14. An imaging system comprising:
    the imaging device according to claim 1; and
    a signal processing unit that processes the signals output from the pixels of the imaging device.

15. A movable object comprising:
    the imaging device according to claim 1;
    a distance information acquisition unit configured to acquire distance information of a distance to an object, from parallax images based on signals from the imaging device; and
    a control unit configured to control the movable object based on the distance information.

* * * * *